(12) United States Patent
Chatterjee et al.

(10) Patent No.: US 6,639,284 B1
(45) Date of Patent: Oct. 28, 2003

(54) COMPENSATED-WELL ELECTROSTATIC DISCHARGE PROTECTION STRUCTURE

(75) Inventors: Amitava Chatterjee, Plano, TX (US); Keith E. Kunz, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/280,829

(22) Filed: Oct. 25, 2002

(51) Int. Cl.[7] ............................................. H01L 23/62
(52) U.S. Cl. ...................................... 257/355; 257/592
(58) Field of Search ............................... 257/355, 592, 257/360, 371, 356, 510, 768, 655; 361/91

(56) References Cited

U.S. PATENT DOCUMENTS

| | | |
|---|---|---|
| 4,939,616 A | 7/1990 | Rountree |
| 5,012,317 A | 4/1991 | Rountree |
| 5,369,041 A | 11/1994 | Duvvury |
| 5,465,189 A | 11/1995 | Polgreen et al. |
| 5,907,462 A | 5/1999 | Chatterjee et al. |
| 6,081,002 A | 6/2000 | Amerasekera et al. |
| 6,303,420 B1 | 10/2001 | Sridhar et al. |
| 2002/0058373 A1 | 5/2002 | Shen et al. |
| 2003/0034527 A1 * | 2/2003 | Amerasekera et al. ...... 257/355 |

OTHER PUBLICATIONS

Rountree et al., "A Process Tolerant Input Protection Circuit for Advanced CMOS Processes", *1988 EOS/ESD Symposium*, pp. 201–205.

Kunz et al., "5–V Tolerant Fail–safe ESD Solutions for 0.18 um Logic CMOS Process", *2001 ESD/EOS Symposium*.

Chatterjee et al., "Analog Integration in a 0.35 um Cu Metal Pitch, 0.1 um Gate Length, Low–power Digital CMOS Technology", *Technical Digest of the International Electron Device Meeting*, Paper 10.1.1 (2001), pp. 211–214.

* cited by examiner

*Primary Examiner*—Mark V. Prenty
(74) *Attorney, Agent, or Firm*—Jacqueline J. Garner; W. James Brady, III; Frederick J. Telecky, Jr.

(57) ABSTRACT

Electrostatic discharge (ESD) protection structures utilizing bipolar conduction are disclosed. The structures each include a parasitic p-n-p bipolar transistor (102); some of the disclosed embodiments include this transistor within a silicon-controlled-rectifier (SCR) type of ESD protection structure. A p+ doped region (116, 216, 316, 416, 516) is disposed at a surface of an n-well (112, 212, 312, 412, 512) overlying a location (115, 215, 315, 415, 515) that receives both the n-well (112, 212, 312, 412, 512) implants and also the p-well (213, 313, 413, 513) implants. Preferably, the well implants are designed to provide retrograde doping profiles. The number of net impurities is reduced, and thus the base Gummel number is lowered, at the compensated well portion (112', 212', 312', 412', 512'), resulting in improved gain for the vertical bipolar device.

21 Claims, 7 Drawing Sheets

COMPENSATED-WELL ELECTROSTATIC DISCHARGE PROTECTION STRUCTURE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to electrostatic discharge protection devices in modern integrated circuits.

Modern high-density integrated circuits are known to be vulnerable to damage from the electrostatic discharge (ESD) of a charged body (human or otherwise) that physically contacts the integrated circuit. ESD damage occurs when the amount of charge exceeds the capability of the conduction path through the integrated circuit. The typical ESD failure mechanisms include thermal runaway resulting in junction shorting, and dielectric breakdown resulting in gate-junction shorting (e.g., in the metal-oxide-semiconductor, or MOS, context).

To avoid damage from ESD, modern integrated circuits incorporate ESD protection devices at each external terminal. ESD protection devices generally operate by providing a high capacity conduction path for the brief but massive ESD charge, safely conducting this energy away from other structures that are not capable of handling the event. In some cases, ESD protection is inherent to the particular terminal, as in the case of a power supply terminal which may provide an extremely large p-n junction that can absorb the ESD charge. Inputs and outputs, on the other hand, typically have a specific ESD protection device added in parallel with the functional terminal. The ideal ESD protection device turns on quickly in response to an ESD event, with large conduction capability, but remains off and presents no load during normal operation.

Examples of ESD protection devices are well known in the art. In the case of MOS technology, an early ESD protection device was provided by a parasitic thick-field oxide MOS transistor that was turned on by and conducted ESD current, as described in U.S. Pat. No. 4,692,781 and in U.S. Pat. No. 4,855,620, both assigned to Texas Instruments Incorporated and incorporated herein by this reference.

As the feature sizes of MOS integrated circuits became smaller, and with the advent of complementary MOS (CMOS) technology, the most popular ESD protection devices utilized a parasitic bipolar device to conduct the ESD current, triggered by way of a silicon-controlled-rectifier (SCR) structure. SCRs are very robust devices, as they can repeatedly conduct relatively large transient currents without being vulnerable to irreversible breakdown damage and the like. The CMOS parasitic SCR is formed by way of a p-type source/drain region serving as the SCR anode, an n-type source/drain region serving as the SCR cathode, and corresponding n-type and p-type wells serving as the bases of the parasitic p-n-p and n-p-n bipolar transistors. Examples of a CMOS parasitic SCR protection device is described in Rountree et al., "A Process-Tolerant Input Protection Circuit for Advanced CMOS Processes", 1988 *EOS/ESD Symposium*, pp. 201–205, and in U.S. Pat. No. 5,012,317 assigned to Texas Instruments Incorporated, both incorporated herein by this reference.

FIG. 1a illustrates, in cross-section, an example of this conventional CMOS parasitic SCR ESD protection device in an integrated circuit. In this example, the structure is formed at a surface of p-type substrate 10, which has n-well 12 formed at a surface. Isolation oxide structures 15, which in this case are field oxide structures formed by conventional LOCOS (local oxidation of silicon), define the active regions of the surface, at which n+ regions 14, 20, and p+ region 16 are formed by masked ion implant. In this arrangement, the anode of the protection device is region 16, which is connected to terminal 18, typically a bond pad for receiving an external connection of the integrated circuit when packaged. N+ region 14 is also formed in n-well 12 along with p+ region 16, and is connected to terminal 18 to ensure that the p-n junction between p+ region 16 and n-well 12 is not forward biased in normal operation. In some cases, for example at CMOS push-pull outputs, n+ region 14 may instead be tied to a power supply ($V_{cc}$) bus of the integrated circuit, rather than to terminal 18. The cathode of the structure is n+ region 20, which is connected to ground in the integrated circuit. In the ESD context, the integrated circuit is not biased to power supply voltages or system ground, and as such the ground connection to n+ region 20 is established by the connection of this region to one or more large doped regions in the integrated circuit, sufficiently large to serve as a sink for the charge received in an ESD event. In operation, as described in U.S. Pat. No. 5,012,317, a positive polarity ESD event received at terminal 18 and applied to regions 14, 16 will forward bias the p-n junction between p+ region 16 and n-well 12, and eventually cause the junction between n-well 12 and p substrate 10 to enter avalanche breakdown. Electrons generated by this avalanche breakdown provide the initial base current for the p-n-p device, and holes generated by this avalanche breakdown provide the initial base current for the n-p-n device. The parasitic p-n-p transistor formed by p+ region 16 (emitter), n-well 12 (base), and p substrate 10 (collector) will then turn on, providing base current to the parasitic lateral n-p-n transistor formed by n+ region 14 and n-well 12 (collector), p substrate 10 (base) and n+ region 20 (emitter). Likewise, the n-p-n device will turn on, providing base current to the p-n-p device. These two parasitic bipolar devices operate as an SCR, and safely conduct the current from the ESD event to the cathode (n+ region 20), preventing damage to functional circuitry connected to terminal 18.

By way of further background, several improvements and modifications have been made over the years to the CMOS SCR protection device design. The SCR breakdown voltage has been reduced by including an n-type source/drain diffusion straddling the well boundary, as described in U.S. Pat. No. 4,939,616, assigned to Texas Instruments Incorporated and incorporated herein by this reference. An example of this structure, commonly referred to as a low voltage SCR (LVSCR), is shown in FIG. 1b. The structure of FIG. 1b is constructed similarly to that of FIG. 1a, but includes an additional n+ region 22 that straddles the boundary of n-well 12. N+ region 22 is effectively resistively connected to terminal 18, with the resistance established by portions of n-well 12 near terminal 18. As described in U.S. Pat. No. 4,939,616, n+ region 22 in the structure of FIG. 1b assists the triggering of the SCR, because of the reduced avalanche breakdown voltage at the junction between relatively heavily doped n+ region 22 and p substrate 10, as compared with the breakdown voltage at the junction between lightly-doped n-well 12 and lightly-doped p substrate 10.

U.S. Pat. No. 5,465,189, assigned to Texas Instruments Incorporated and incorporated herein by this reference, describes a CMOS SCR (commonly referred as the "LVTSCR") in which the n-type source/drain region straddling the well boundary is gated. An example of a structure according to this approach is shown, in cross-section, in FIG. 1c. In this example, n+ region 22 straddles the boundary of n-well 12 as in the case of FIG. 1b. Polysilicon electrode 26 is disposed between n+ region 22 and n+ region 20 (which is outside of n-well 12), overlying gate dielectric 24, thus forming an MOS transistor. Gate electrode 26 is connected to ground, either directly, as shown, or alternatively through a resistor, as described in U.S. Pat. No. 5,907,462. N+ region 20 is also connected to ground. As described in U.S. Pat. No. 5,465,189, this gated device effectively defines a desired low SCR trigger voltage.

U.S. Pat. No. 5,907,462, assigned to Texas Instruments Incorporated and incorporated herein by this reference, describes a CMOS SCR with a gated well diode. FIG. 1d illustrates an example of an SCR protection device of this type. The SCR portions of this structure within n-well 12 is similar to that of the example of FIG. 1a. Gate electrode 28 overlies gate dielectric 27, straddling the well boundary and overlapping onto field oxide structure 15. Gate electrode 28 is connected to ground, along with n+ region 20 outside of n-well 12, as shown. In operation, as described in U.S. Pat. No. 5,907,462, gate electrode 28 is the gate of a parasitic MOS device, having n-well 12 as its drain and n+ region 20 as its source, and which turns on in response to an ESD event to assist the triggering of the SCR.

In recent years, however, many modern high-performance integrated circuits have begun using devices other than SCRs for ESD protection. Gate-coupled nMOS devices have become popular, because the fast switching time of these devices provides improved performance according to the Charged Device Model (CDM), which models electrostatic discharge from a charged integrated circuit to ground. It has been observed that the switching times of parasitic SCRs are relatively slow, in modem advanced CMOS devices, because the gain of the parasitic bipolar devices is generally quite low. One cause of this low gain is the use of retrograde well ion implant profiles (i.e., increasing dopant concentration with depth into the semiconductor), which has the effect of blocking vertical conduction paths through the SCR. Another cause of low bipolar gain in SCR protection devices in advanced CMOS processes stems from shallow trench isolation (STI) structures, serving as isolation oxide structures in place of conventional LOCOS field oxide structures in modern CMOS processes. These STI structures block the lateral conduction path from anode to cathode, effectively decreasing the gain of the triggering parasitic bipolar transistor. For example, the current gain p of the parasitic bipolar transistors in prior LOCOS CMOS SCR protection devices typically ranges from about 10 to 30; in modern advanced CMOS processes, the parasitic bipolar typically has unity gain.

By way of further background, U.S. Pat. No. 6,081,002, assigned to Texas Instruments Incorporated and incorporated herein by this reference, describes an SCR-based ESD protection device for use in a CMOS technology using shallow trench isolation (STI) structures. FIG. 1e illustrates an example of a device according to this approach, in which STI structure 109 is disposed between n+ region 14 and p+ region 16 in n-well 12. P+ region 22 straddles the well boundary. Gate electrode 26 is disposed between n+ region 20 and region 22 and is biased to ground with n+ region 20, while gate electrode 30 is disposed between region 22 and p+ region 16, overlying a gate dielectric, and is connected to terminal 18. In operation responsive to an ESD event at terminal 18, the junction between n-well 12 and p+ region 22 will break down, triggering the SCR to safely conduct the ESD energy. Alternatively, as described in U.S. Pat. No. 6,081,002, region 22 may be doped n+, in which case the NMOS transistor gated by gate electrode 26 will break down by punchthrough between source and drain regions 20, 22 via p-substrate 10, also triggering the SCR. Further in the alternative, as described in U.S. Pat. No. 6,081,002, region 22 may be constructed as an adjacent pair of p+ and n+ regions, enabling both triggering mechanisms. Also as described in this Patent, gate electrode 30 defines an isolation transistor, eliminating the need for an STI structure at that location and thus avoiding the loss of bipolar gain that such an isolation structure would present. In addition to providing the parasitic MOS transistor function, gate electrodes 26 and 30 also serve to block the formation of silicide at the surface of p substrate 10 and n-well 12, respectively. The presence of silicide at these locations would result in the shorting of regions 16, 20, and 22, n-well 12 and p-substrate 10.

Another approach toward avoiding the gain degradation of STI structures involves an SCR structure in combination with a drain-extended nMOS (DENMOS) device, as described in Kunz et al., "5-V Tolerant Fail-safe ESD Solutions for 0.18 $\mu$m Logic CMOS Process", *ESD/EOS Symposium* (Sep. 11, 2001), incorporated herein by this reference. An example of this structure is illustrated, in cross-section, in FIG. 1f. In this example, DENMOS transistor 9 is in parallel with SCR 11. Source region 31 of transistor 9 is connected to ground, while drain 14 is located within n-well 12, and is connected to terminal 18-at the anode of SCR 11, along with p+ region 16. P+ region 16 and n+ drain region 14 are separated from one another by shallow trench isolation STI structure 19. P+ region 16 is also located within n-well 12, as is a portion of n+ trigger region 22 in SCR 11. The cathode of SCR 11 is n+ region 20, which is biased to ground and disposed within p-type substrate 10. Each of heavily-doped regions 14, 16, 20, 22, 31 are clad with metal silicide film 28, as are other diffused regions within the same integrated circuit, for improved conductivity. In this structure of FIG. 1f, silicide formation is blocked by nitride structures 32 and polysilicon gate 34, formed by conventional photolithography and patterned etches. Gate 34 is the gate electrode of DENMOS transistor 9, and its nitride structures 32 are sidewall filaments. More specifically, the nitride structures 32 on either side of n+ region 28 block the formation of silicide and also block the source/drain implants, but since these structures 32 are not adjacent to gate polysilicon, the formation of these blocking nitride structures 32 requires an additional photolithography and etching step. Furthermore, the asymmetry between thicker nitride structure 32 on the drain side of gate 34 (i.e., adjacent to n+ region 28) and thinner nitride structure 32 on the source side, also requires the use of a silicide block pattern. In operation, as described in the Kunz et al. article, SCR 11 is triggered by either junction breakdown between n+ region 22 and p-substrate 10, or by punchthrough between n+ regions 22, 20 through p-substrate 10. As described in the Kunz et al. article, the voltage at which n+ region triggers the SCR action depends on strongly on the width of the channel between n+ regions 20, 22 that underlies nitride structure 32. However, this approach requires a photolithography operation to create structures 32 that block or mask the formation of silicide film 28 on the silicon surface. If this mask level is not otherwise available for other devices in the same integrated circuit, as it often is not, the additional cost for forming an ESD protection device according to FIG. 1f is significant.

While these approaches address the degraded bipolar gain caused by STI isolation structures, it is contemplated that other factors presented by advanced CMOS processes still limit the implementation of SCR-based structures in these technologies. As mentioned above, many advanced CMOS technologies utilize retrograde well doping profiles that limit the vertical conduction in ESD protection devices, and thus the parasitic bipolar transistor gain. In addition, many important integrated circuits are still required to have relatively high voltage swings at their input/output terminals, relative to the robustness of the manufacturing technology. In many of these high voltage I/O integrated circuits, the gate-coupled MOSFET has too low of a breakdown voltage (i.e., close to normal operating voltages) to permit their use in an ESD protection device.

By way of further background, the use of a compensated well in a vertical bipolar transistor is known, as described in copending application Ser. No. 09/977,025, filed Oct. 12, 2001, published as U.S. Patent Application Publication US/2002/0058373 A1 on May 16, 2002, commonly assigned herewith and incorporated herein by this reference.

By way of further background, the use of a counterdoped well in a drain-extended MOS transistor is known, as described in copending application Ser. No. 09/669,391, filed Sep. 26, 2000, commonly assigned herewith and incorporated herein by this reference.

BRIEF SUMMARY OF THE INVENTION

It is therefore an object of this invention to provide an electrostatic discharge (ESD) protection device that is useful with advanced complementary metal-oxide-semiconductor (CMOS) manufacturing technologies.

It is a further object of this invention to provide such a device utilizing parasitic bipolar conduction with high gain.

It is a further object of this invention to provide such a device that utilizes thyristor (SCR) conduction for ESD protection.

It is a further object of this invention to provide such a device that can be fabricated without requiring an additional photolithography mask and exposure.

It is a further object of this invention to provide such a device that is compatible with relatively high operating voltages.

Other objects and advantages of this invention will be apparent to those of ordinary skill in the art having reference to the following specification together with its drawings.

The present invention may be implemented in an ESD protection device that relies on parasitic bipolar conduction. In one aspect of the invention, the protection device is a vertical bipolar transistor; in other aspects of the invention, the protection device is an SCR (cross-coupled p-n-p and n-p-n bipolar transistors). In each case, the base region of the parasitic transistor is formed by way of compensated well implants of both the p-well and the n-well implants. Preferably, at least the p-well implant forms a retrograde dopant concentration with depth. A shallow n-type base region is formed, having a relatively low Gummel number, which results in reasonable bipolar gain.

DETAILED DESCRIPTION OF THE INVENTION

This invention is directed to the protection of integrated circuits from electrostatic discharge (ESD), and will be described in this specification in connection with several preferred embodiments for which this invention is contemplated to be particularly beneficial. However, it is also contemplated that this invention will be of benefit in many applications and realizations other than those described in this specification. It is therefore to be understood that these and other alternatives to the described embodiments are within the scope of the invention as claimed.

Figure 2A:
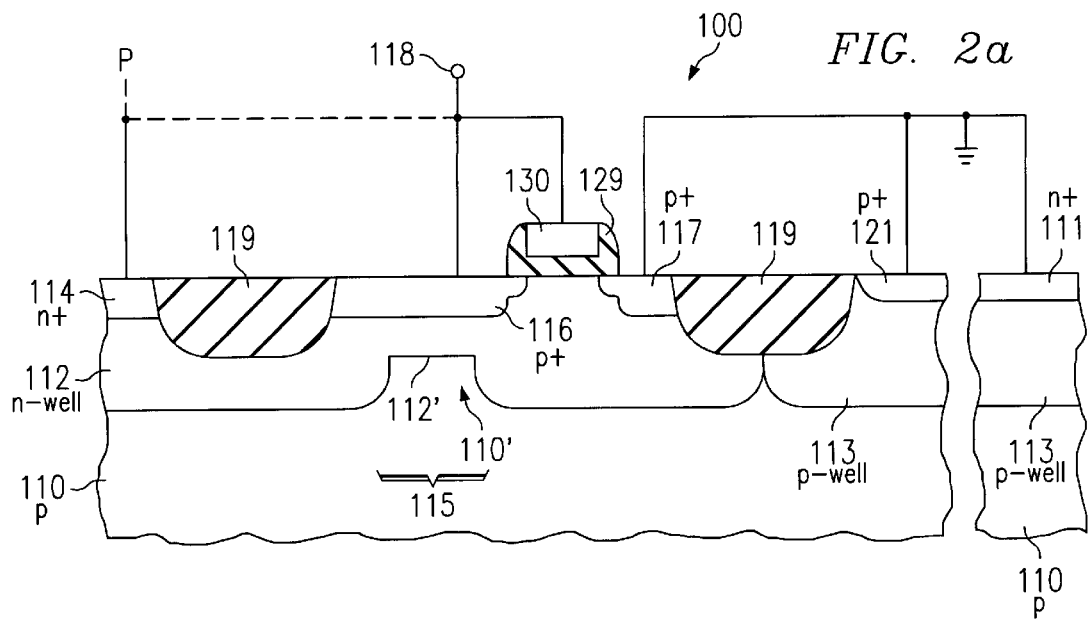
FIG. 2a is a cross-sectional view of an ESD protection device according to a first preferred embodiment of the invention.
Figure 2B:
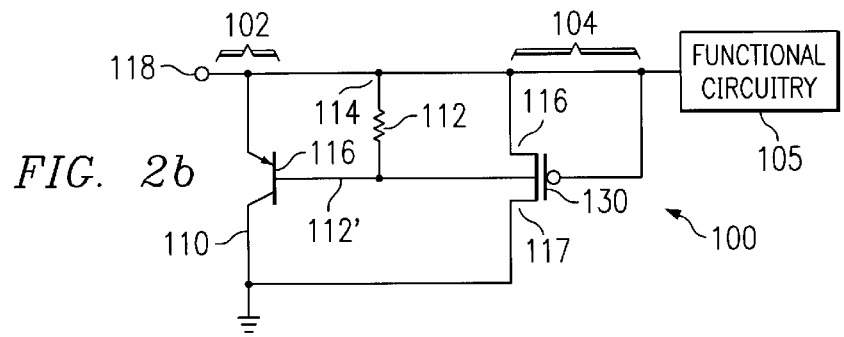
FIG. 2b is an electrical schematic of the ESD protection device of FIGS. 2a and 2c according to the first preferred embodiment of the invention.
Figure 2C:
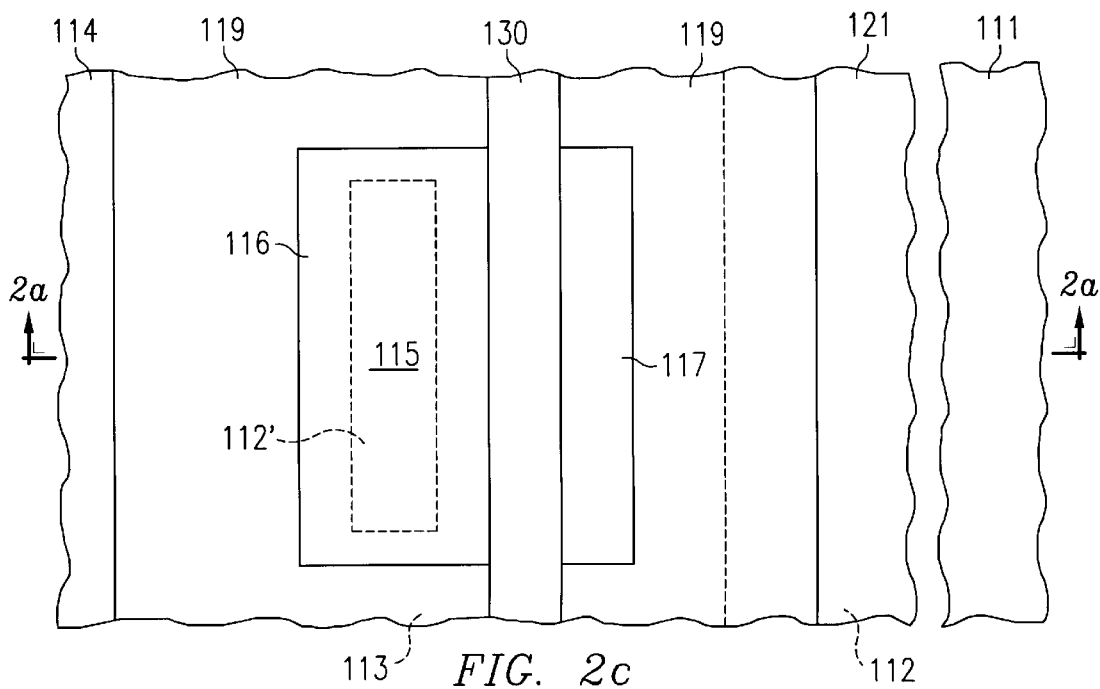
FIG. 2c is a plan view of the ESD protection device of the ESD protection device of FIGS. 2a and 2b, according to the first preferred embodiment of the invention.

Referring now to FIGS. 2a through 2c, ESD protection device 100 according to a first preferred embodiment of the invention will now be described in detail. According to this embodiment of the invention, as evident from FIG. 2b, ESD protection device 100 includes vertical p-n-p bipolar transistor 102, in combination with p-channel MOS transistor 104, which has its gate connected to its source so as to be off in normal operation. Transistors 102, 104 are connected to terminal 118, which corresponds to a bond pad or other external connection terminal of the integrated circuit, and thus are connected in parallel with functional circuitry 105 of the integrated circuit. As is fundamental in this art, ESD protection device 100 is intended to safely conduct transient current that appears at terminal 118, for example from an electrostatic discharge (ESD) event. This transient current is thus prevented from reaching, and damaging, functional circuitry 105.

As shown in FIG. 2a for this example, ESD protection structure 100 is formed at a surface of p-type substrate 110. According to this embodiment of the invention, the integrated circuit including ESD protection structure 100 is fabricated according to an advanced twin-well CMOS process, and as such wells 112, 113 of n-type and p-type conductivity, respectively, are provided. In this advanced process, shallow trench isolation (STI) structures 119 serve to isolate active regions from one another. As opposed to thermal field oxide, STI structures 119 may be relatively narrow, permitting their use in high-performance high-density integrated circuits.

Terminal 118 is connected to n+ doped region 114 and p+ doped region 116, at the surface of n-well 112, by overlying metal conductors and contacts (not shown). Alternatively, n+ region 114 may be connected to a power supply rail (e.g., $V_{cc}$) if appropriate for the circuit implementation. N+ region 114 and p+ region 116 are separated from one another by STI structure 119. P+ region 117 is also located at a surface of n-well 112, and is separated from p+ region 116 by gate structure 130. Gate structure 130 is a conventional MOS transistor gate structure, as may be used elsewhere in the integrated circuit, and in this example is insulated from the surface of n-well 112 by a gate dielectric. Also in this example, p+ regions 116, 117 include lightly-doped drain (LDD) extensions, and as such gate structure 130 has insulator sidewalls 129 that define these LDD extensions. Each of regions 111, 114, 116, 117 (and 121), and gate structure 130, may be clad with a metal silicide, such as cobalt silicide, titanium disilicide, or another silicide of a refractory metal, if desired, for improved conductivity elsewhere in the integrated circuit. Such silcide cladding may be performed by the conventional direct reaction process, carried out by depositing a layer of a refractory metal such as cobalt overall, and heating the structure to react the refractory metal with the underlying silicon at those locations (doped regions and polysilicon electrodes, for example) at which they are in contact; the unreacted metal is then removed to leave the silicide-clad silicon features.

P+ region 117 is connected to p+ region 121, and to ground, by way of an overlying metal conductor and contacts (not shown). The connection to ground is somewhat a virtual connection, in the ESD context, because ESD protection is to be provided by device 100 when the integrated circuit is not biased to power supply voltages and ground. Accordingly, ground in the ESD context refers to the ground lines and corresponding bond pads of the integrated circuit. Generally, this ground is connected to a relatively large diffused region in the integrated circuit, for example as may be presented by the regions that provide ground potential throughout functional circuitry 105 in the integrated circuit. Typically, the power supply lines and ground lines have a large enough capacitance associated with them to absorb transient current, for example resulting from an ESD event, and as such effectively serve as device ground for ESD protection device 100. P+ region 121 is disposed at the surface of p-well 113, isolated from p+ region 117 in n-well 112 by STI structure 119. Alternatively, these p+ regions 117, 121 need not be isolated from one another (i.e., STI structure 119 may be omitted), because they are both at ground potential. In addition, n+ region 111 is also preferably formed at a surface of p-well 113, and is connected to ground (or is charge-pumped to a lower voltage) to provide the proper bias of p-well 113 during normal operation.

Referring again to FIG. 2b, in combination with FIG. 2a, p+ region 116 serves as the emitter of p-n-p transistor 102; substrate 110 (in combination with p-well 113 and p+ region 121) is the collector of this device, and n-well 112, connected through n+ region 114, serves as the base. N-well 112 is also the body node of pMOS transistor 104, which has p+ region 117 as its drain and p+ region 116 as its source; gate electrode 130, as mentioned above, is the gate of transistor 104. In operation responsive to an ESD event of positive polarity at terminal 118, the emitter-base junction of transistor 102, between p+ region 116 and n-well 112, becomes forward-biased, and the collector-base junction between p substrate 110 and n-well 112 is reverse-biased. Upon sufficient ESD energy being applied to terminal 118, pMOS transistor 104 enters avalanche breakdown, specifically at the junction between p+ region 117 and n-well 112, because of the relatively high doping concentration of p+ region 117 (relative to p substrate 110 and p-well 113). The carriers from this avalanche breakdown serves as base current to transistor 102, turning transistor 102 on so that the ESD current is conducted safely from emitter of p+ region 116 to the collector of p substrate 110. Once the ESD transient is over, transistors 102, 104 return to an off state, adding no load to signals passing between terminal 118 and functional circuitry 105.

According to this embodiment of the invention, the conduction of the ESD energy is enhanced by compensated well portion 112' at location 115 of the structure, underlying p+ region 116. Location 115 receives both the implants used to form n-well 112 and to form p-well 113. Compensated well portion 112' provides a shallower portion of n-well 112, resulting in an n-type region that has a lower net doping (net number of impurities) than other portions of n-well 112 underlying p+ region 116. Therefore, this compensation of n-well 112' decreases the base Gummel number of p-n-p transistor 102, which increases the common-emitter current gain β of this device, and improves the ESD protection provided by ESD protection structure 100.

As well known in the art, the common-base current gain β of a p-n-p transistor can be expressed as:

$$\beta = \frac{\alpha}{1-\alpha} = \frac{\gamma T'}{1-\gamma T'}$$

where α is the common-base current gain, which is expressed as the product of emitter efficiency γ and base transport factor T'. As is also well known in the art, for reasonable transistors, the emitter efficiency γ increases with decreasing base Gummel number. As known in the art, the Gummel number is the net number of impurities integrated over the base region; in this case of a p-n-p device, the net impurities are n-type (donors less acceptors).

According to this embodiment of the invention, the compensation of n-well portion 112' with the superposed boron from the p-well implants at location 115 results in a lower base Gummel number for the vertical p-n-p transistor 102, because the net number of impurities in the base region is reduced from what it would have been if non-compensated n-well 112 served as the base. As a result, the emitter efficiency γ is increased by this lower base Gummel number, resulting in high common-base and common-emitter gains α, β, respectively.

Figure 3A:
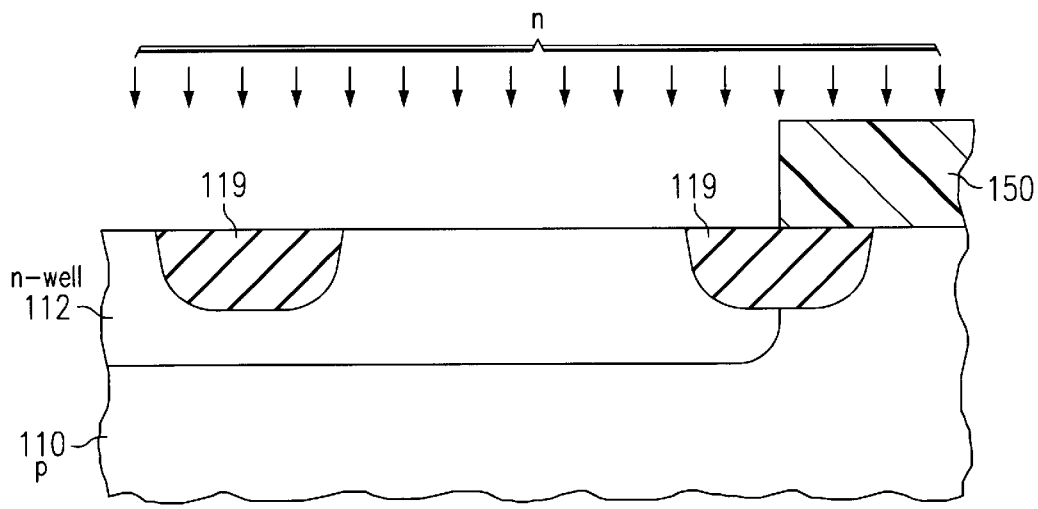
FIGS. 3a through 3c are cross-sectional views illustrating a process of fabricating the protection device of FIGS. 2a through 2c according to the first preferred embodiment of the invention.
Figure 3B:
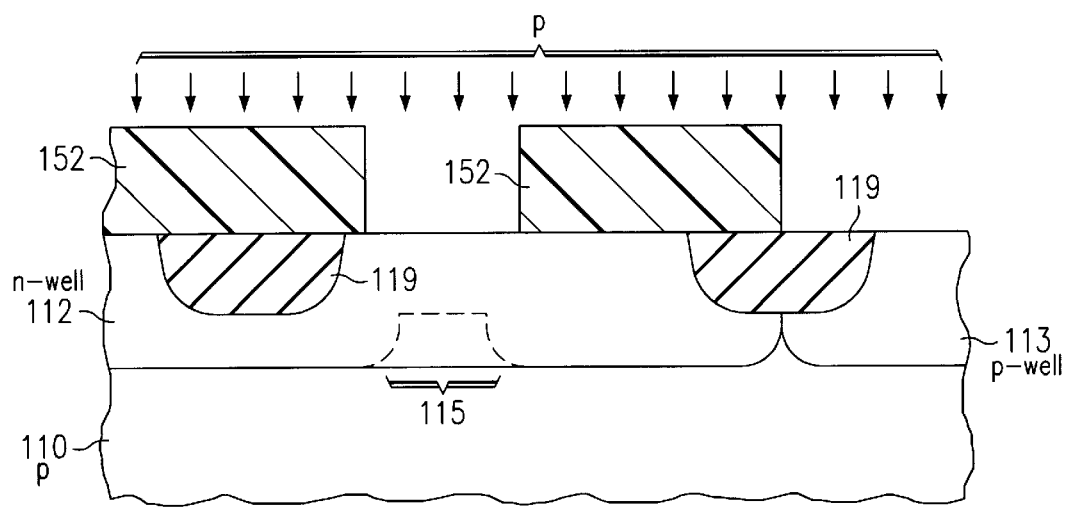
Figure 3C:
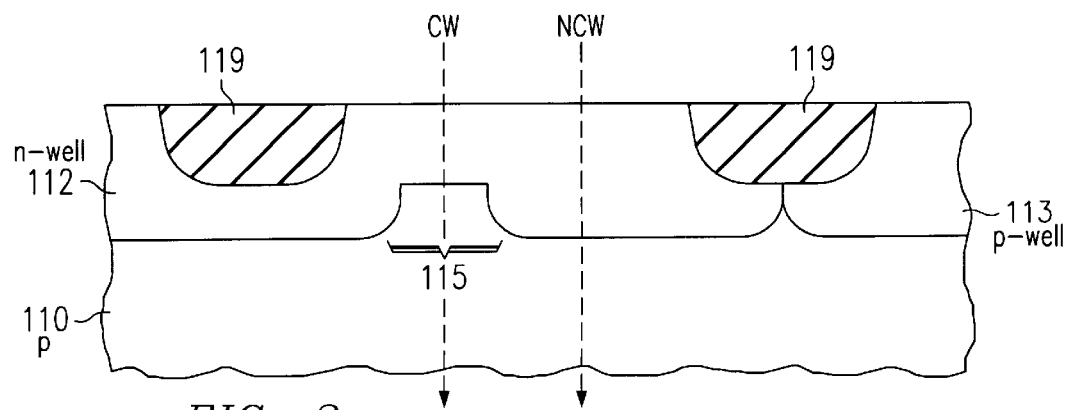

Referring now to FIGS. 3a through 3c, in combination with FIG. 2a, a method of fabricating ESD protection device 100 according to this first preferred embodiment of the invention will now be described, particularly relative to the fabrication of compensated well portion 112'. Additional detail regarding examples of the construction of compensated well portion 112' is described in copending application Ser. No. 09/977,025, filed Oct. 12, 2001, published in U.S. Patent Application Publication US/2002/0058373 A1 on May 16, 2002, commonly assigned herewith and incorporated herein by reference, and in Chattelee, et al., "Analog Integration in a 0.35 μm Cu Metal Pitch, 0.1 μm Gate Length, Low-power Digital CMOS Technology", *Digest of Technical Papers, International Electron Device Meeting* (IEEE, December 2001), pp. 10.1.1 through 10.1.4, also incorporated herein by this reference.

FIG. 3a illustrates the integrated circuit structure at a point in the manufacturing process at which n-well 112 is being formed. At this point, STI structures 119 have already been formed at selected locations of the surface of substrate 110, between the eventual active regions of the device. STI structures 119 are formed in the conventional manner, which in summary includes the etching of shallow trenches into the surface of substrate 110, the deposition of a conformal silicon dioxide into the trenches and over the surface of substrate 110, followed by chemical mechanical polishing (CMP) of the structure to planarize the surface of STI structures 119 with the surface of substrate 110.

The locations at which n-well 112 are to be formed by ion implantation are defined by mask layer 150. These locations include both those within ESD protection structure 100 itself, and also the locations elsewhere in the integrated circuit at which p-channel MOS transistors are to be formed. Mask layer 150 is preferably photolithographically patterned photoresist, removed from the locations of the surface of substrate 110 that are to receive the n-well implant, and remaining elsewhere at a sufficient thickness to block the implant. Alternatively, materials other than photoresist may be used as mask layer 150.

Figure 4A:
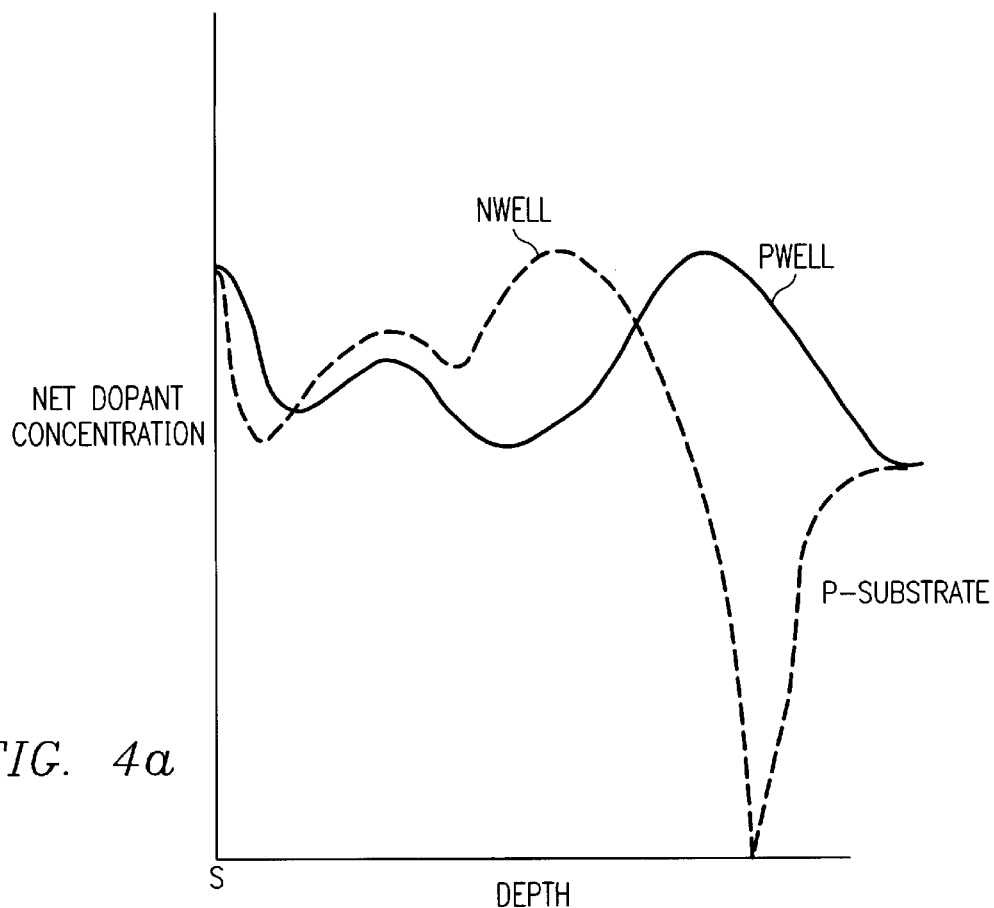
FIGS. 4a and 4b are plots of dopant concentration versus depth, with FIG. 4a illustrating the well implants used in the formation of the device of FIGS. 2a through 2c, and FIG. 4b illustrating the dopant concentration versus depth in the compensated and non-compensated well locations of the device of FIGS. 2a through 2c, according to the first preferred embodiment of the invention.

An n-type ion implant according to this embodiment of the invention is then performed, to form n-well 112 at the desired location, as shown in FIG. 3a. According to the preferred embodiment of the invention, the n-well implant is a four step implant designed to achieve a retrograde dopant profile, an example of which is illustrated by plot NWELL in FIG. 4a. As shown in FIG. 4a, the n-well implant only reaches a certain depth into the structure, below which the net dopant profile is defined by p-type substrate 110. The plots of FIG. 4a qualitatively illustrate the absolute value of the dopant concentration provided by the n-well and p-well implants according to this exemplary implementation of the invention. In this example, the four-step n-well implant includes a phosphorous well implant at a dose of $5E13$ $cm^{-2}$ and an energy of 500 keV, a phosphorous channel stop implant at a dose of $4E12$ $cm^{-2}$ and an energy of 150 keV, a phosphorous punch through implant at a dose of $1E12$ $cm^{-2}$ and an energy of 50 keV, and a phosphorous threshold voltage adjust implant at a dose of $5E12$ $cm^{-2}$ and an energy of 30 keV. Other dopants, such as arsenic, may alternatively be used for one or more of these implants. The particulars of the n-well implant may vary according to the specific device parameters desired, especially for the p-channel MOS transistors formed elsewhere in integrated circuit. A post implant anneal may then be performed, to diffuse the implanted dopant to the desired profile and to anneal out any implant damage; this anneal may be performed in a conventional furnace operation, or alternatively by rapid thermal anneal (RTA).

Following the performing of the n-well implant, mask layer 152 is then formed over the surface of substrate 110, by conventional photolithography, to expose those locations that are to receive a p-type well implant, and to protect the other locations. As before, the material of mask layer 152 may be photoresist, or such other suitable mask material, in either case of adequate thickness to block the implants. According to this embodiment of the invention, an opening is formed through mask layer 152 at location 115, for the formation of compensated n-well portion 112' by receiving the compensating p-well implants, as shown. Of course, other locations of the integrated circuit also are exposed by mask layer 152, such locations including those at which n-channel MOS transistors are to be formed. The p-well ion implantation is then performed, as shown in FIG. 3b.

According to this embodiment of the invention, the p-well implant is a four-step implant, designed to form a retrograde doping profile, for example as shown by plot PWELL in FIG. 4a, with the p-type implant extending into the structure to the point at which the net dopant concentration is defined by p-substrate 110. An example of this four-step implant includes a boron well implant at a dose of $5E13$ $cm^{-2}$ and an energy of 300 keV, a boron channel stop implant at a dose of $8E12$ $cm^{-2}$ and an energy of 100 keV, a boron punch through implant at a dose of $1E12$ $cm^{-2}$ and an energy of 30 keV, and a boron threshold voltage adjust implant at a dose of $5E12$ $cm^{-2}$ and an energy of 10 keV. The particulars of the p-well implant may vary according to the specific device parameters desired, especially for the n-channel MOS transistors formed elsewhere in integrated circuit. Following the p-well implant, a post-implant anneal may then be performed to diffuse the implanted dopant to the desired profile and to anneal out any implant damage; this anneal may be performed in a conventional furnace operation, or alternatively by rapid thermal anneal (RTA).

Of course, several alternatives to the specific implant sequences described above may also be used. The n-well and p-well ion implantation may be reversed in order, if desired, with the p-well implant being performed prior to the n-well implant. The post-implant anneal may be performed only after the second of the two sets of well implants, or alternatively after each of the well implants (e.g., after the n-well implant, and then again after the p-well implant). The number of different implants to be performed may also be changed, as may the doses and energies. It is contemplated that those skilled in the art having reference to this specification will be readily able to design the implant sequences to achieve the desired doping profile.

Following the p-well implant illustrated in FIG. 3b, compensated n-well portion 112' at location 115 is shallower and has a reduced net number of (n-type) impurities, than does the remainder of n-well 112. This construction is due to the compensation of the n-well implanted dopant with that of the p-well implanted dopant at location 115, which receives both the n-well and the p-well implants. Because of the retrograde nature of the well implants, compensated n-well portion 112' at location 115 has a doping profile that will be particularly well suited for the base region of a bipolar transistor, as will be described below.

Completion of the device is then performed, by the formation of transistor gate dielectric layers, gate electrodes (e.g., gate structure 130), sidewall filaments 129 that provide a stepped junction for the source and drain of the MOS transistors, and overlying conductor and insulating layers. The resulting structure is illustrated in FIG. 2a, described above. The construction of doped regions 114, 116, 118, 120, gate electrode 130, and of the other elements (including some not shown, such as silicide cladding if desired, interlevel insulator layers, and the deposition and photolithographic metallization for upper level conductors), is accomplished according to conventional techniques used in modern MOS fabrication.

Figure 4B:
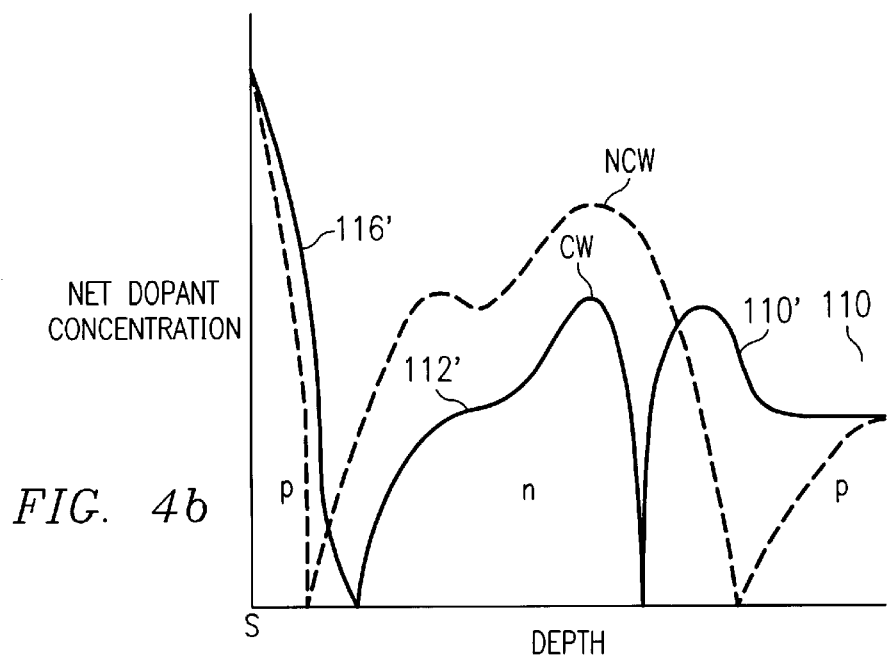

The dopant profile of the structure through compensated n-well portion 112' at location 115, along arrow CW of FIG. 3c, and after the formation of overlying p+ region 116, is illustrated by plot CW in FIG. 4b. This particular doping profile is obtained by the implanting of location 115 with both the n-well and p-well implants, preferably with retrograde implanted dopant profile. In contrast, FIG. 4b also illustrates the doping profile along arrow NCW of FIG. 3c, again after the formation of p+ region 116. This doping profile follows a path that is away from location 115, extending through p+ region 116, n-well 112, and substrate 110. Comparing plots CW and NCW in FIG. 4b, plot CW shows lower net doping in the base, corresponding to a very desirable profile for a bipolar transistor, with distinct and sharp peaks exhibited for each of regions 116, 112', 110'

(which is the p-type region underlying compensated n-well portion 112' at location 115). In particular, the compensated well doping of plot CW provides for a relatively sharp peak and rapid dropoff in the base region of compensated n-well portion 112'. In contrast, the doping profile of plot NCW in FIG. 4c has a relatively wide and substantial number of n-type impurities in n-well 112. As a result, the net number of impurities in the base region of compensated n-well portion 112' (FIG. 4b) is significantly less than n-well 112 (FIG. 4c), which translates to a lower base Gummel number and thus higher gain for the device including compensated n-well portion 112'. Conversely, the base width exhibited by plot NCW in FIG. 4c, is much wider, which translates to a relatively large base Gummel number and thus poor gain for a bipolar transistor that would have n-well 112 as its base, as is conventional in the art.

As noted above, referring back to FIGS. 2a and 2b, because of the improved gain of vertical bipolar p-n-p transistor 102, the speed and amount of conduction provided by transistor 102 once turned on in an ESD event is in turn much improved. This improved gain, and thus improved ESD protection, is attained without adding significant cost to the manufacturing process, because no additional implant or masking step is required to form the compensated well portion 112'. In addition, because the protection device is substantially based on bipolar conduction, ESD protection structure 100 according to this embodiment of the invention is well suited for high voltage terminals, such as input/output terminals for analog and mixed-signal applications. Excellent ESD protection is thus provided by this bipolar conduction, while avoiding additional cost and avoiding the vulnerabilities of MOS protection devices.

Figure 5A:
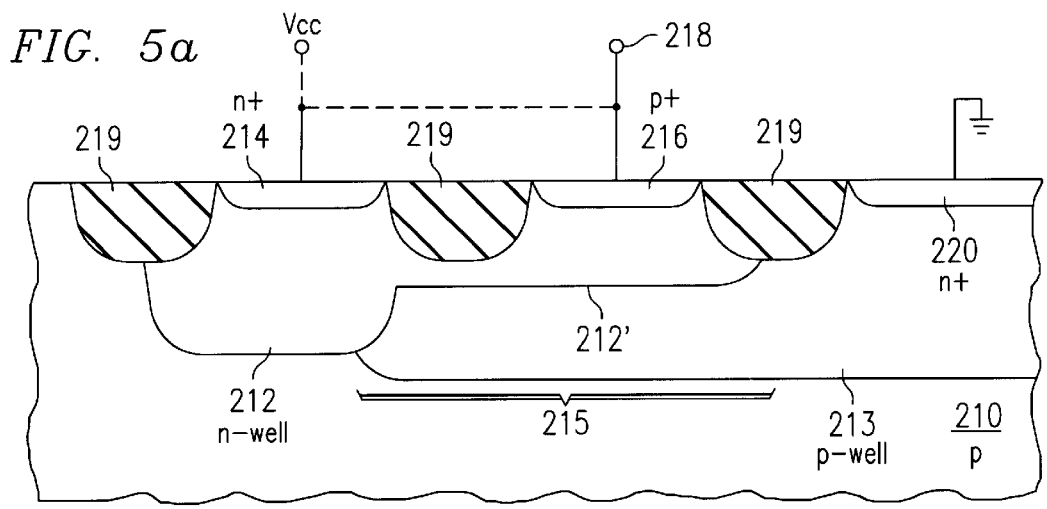
FIGS. 5a through 5f are cross-sectional views of alternative preferred embodiments of this invention.

According to additional embodiments of this invention, the compensated well approach can be used in connection with thyristor, or SCR, type of ESD protection devices. A first example of an SCR ESD protection device according to an alternative embodiment of the invention is illustrated in FIG. 5a. In this example, a CMOS SCR is provided by n+ region 214 and p+ region 216 within n-well 212, which in turn is disposed within substrate 210. N+ and p+ regions 214, 216 are isolated from one another by STI structure 219; other STI structures 219 are disposed at the well boundaries adjacent to n+ and p+ regions 214, 216.

In this embodiment of the invention, n+ region 220 is formed within p-well 213. P-well 213 extends not only under n+ region 220, but also under an instance of STI structure 219 to underlie p+ region 216. Additional bias points for p-well 213 (e.g., analogous to n+ region 111 of FIG. 2a) are provided in the known manner, but are not shown in FIGS. 5a through 5e for clarity. Referring back to FIG. 5a, location 215 of substrate 210 underlying p+ region 216 thus receives both the n-type implants that form n-well 212 and also p-type implants that form p-well 213. As before, it is preferred that the n-well and p-well implants are designed to provide retrograde doping profiles. Because this location of substrate 210 underlying p+ region 216 receives both implant types, compensated n-well portion 212' is formed at location 215, having a lower number of net n-type impurities than the non-compensated portions of n-well 212. This compensated well portion 212' thus lowers the base Gummel number of the parasitic vertical p-n-p transistor, having p+ region 216 as an emitter, compensated n-well portion 212' as a base, and p-well 213 and p substrate 210 as a collector. With this lowered Gummel number, the gain of this p-n-p device is improved, relative to its gain in the case with a full thickness of n-well as its base. With this improved gain, the implementation of an SCR-type ESD protection device again becomes attractive for use even in advanced CMOS processes, including those using STI isolation and also silicide-clad source/drain regions. The ability to use an SCR provides an ESD protection scheme for high voltage input/output terminals, as compared with protection devices such as drain-extended MOS transistors.

Figure 1A:
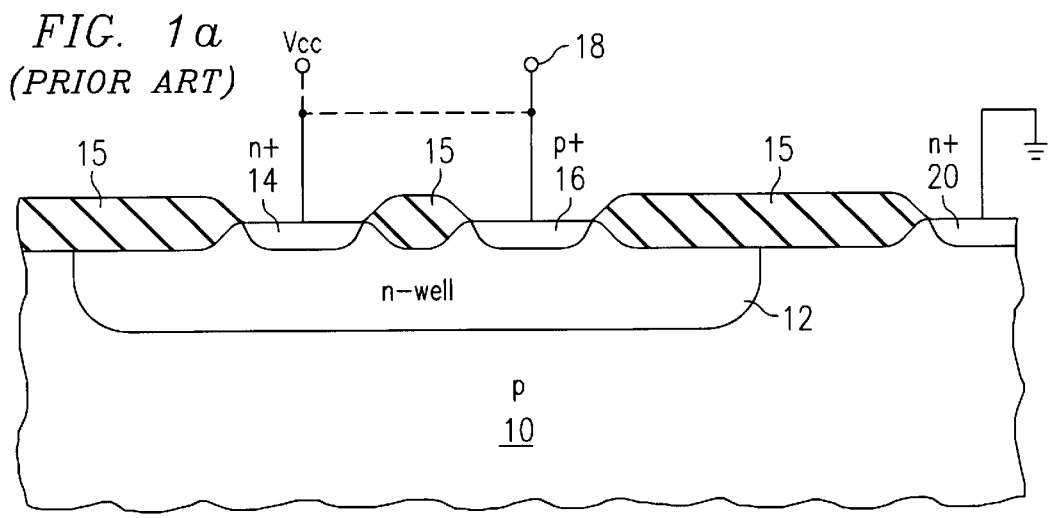
FIGS. 1a through 1f are cross-sectional views of conventional ESD protection devices.
Figure 1B:
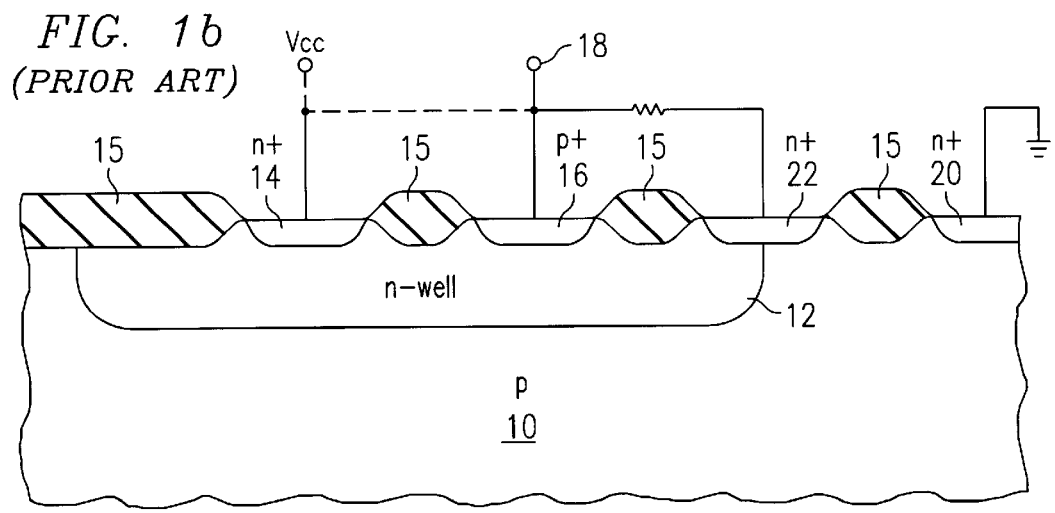
Figure 1C:
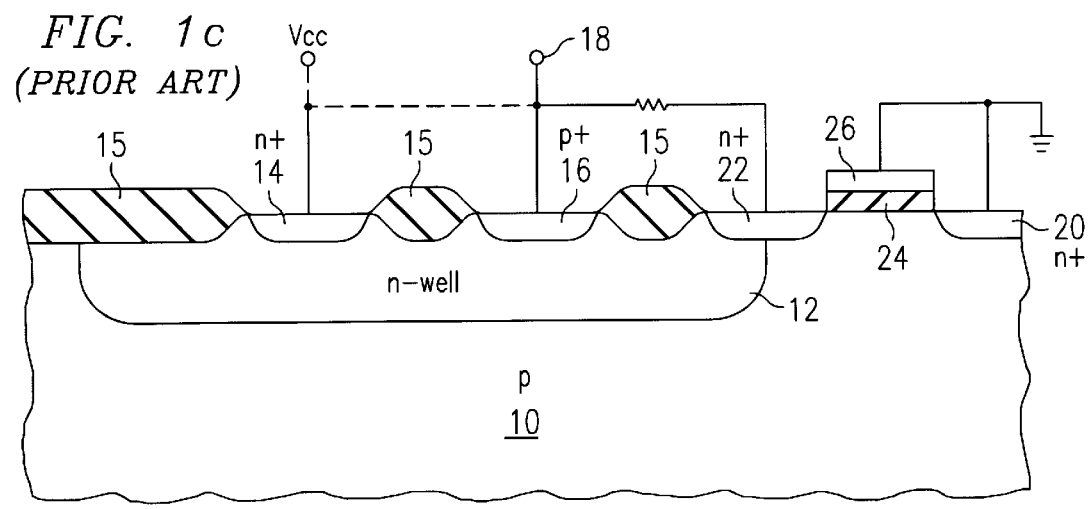
Figure 5B:
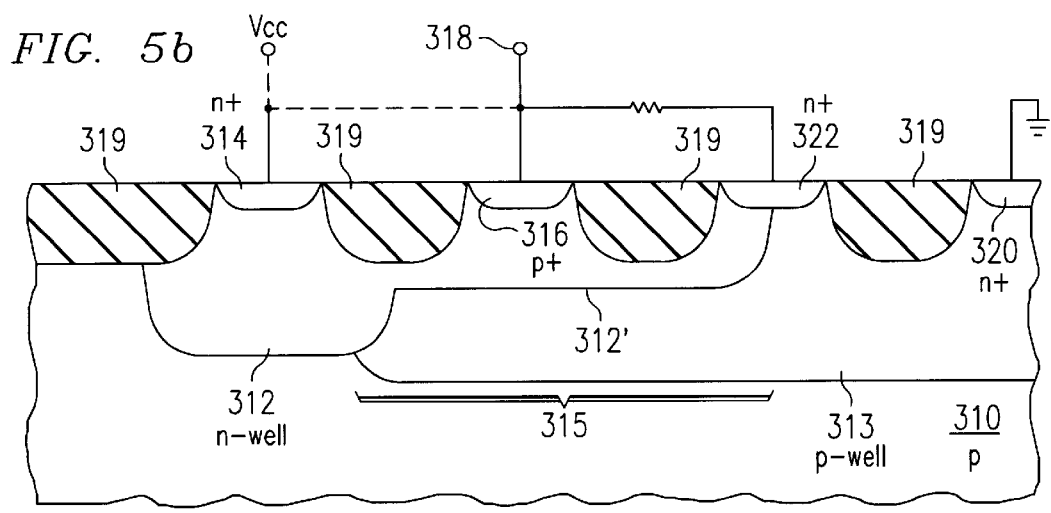

FIG. 5b illustrates a low voltage SCR ESD protection device according to another embodiment of the invention. The device of FIG. 5b is similar to that of FIG. 5a, but additionally includes n+ region 322 that straddles the boundary of n-well 312, isolated from p+ region 316 in n-well 312 and from n+ region 320 in p-well 313 by STI structures 319. N+ region 322 is resistively connected to terminal 318, preferably by way of narrow diffused regions. Similar to the conventional LVSCR of FIG. 1b described above, and described in U.S. Pat. No. 4,939,616, n+ region 322 assists the triggering of the SCR device, because the breakdown voltage is lowered by the relatively high dopant concentration of n+ region 322 at its boundary with p-well 313, relative to the breakdown voltage at the junction between n-well 312 and p-well 313. The triggering voltage of the device of FIG. 5b is therefore relatively low.

According to this embodiment of the invention, n-well 312 and p-well 313 overlap one another to form compensated n-well portion 312', which underlies p+ region 316 in n-well 312. This overlap is formed by implanting location 315 with both the n-type implants that form n-well 312 and the p-type implants that form p-well 313, both well implants preferably designed to provide a retrograde doping profile. Compensated well portion 312' at location 315 thus serves as the base of a parasitic vertical p-n-p transistor with an emitter of p+ region 316, and a collector of p-well 313 and p substrate 310. The net number of impurities in well portion 312' at location 315 is less than that of n-well 312, and thus the parasitic vertical p-n-p transistor having compensated well portion 312' as its base has a lower base Gummel number, improving the gain of the parasitic p-n-p device relative what the gain would be if its base were with a full thickness of n-well 312. This improved gain, in combination with the low trigger voltage provided by n+ region 322, makes an SCR-type ESD protection device attractive for use in advanced CMOS processes, including those using STI isolation and also silicide-clad source/drain regions. The SCR is particularly attractive for use at high voltage input/output terminals, as mentioned above.

Figure 5C:
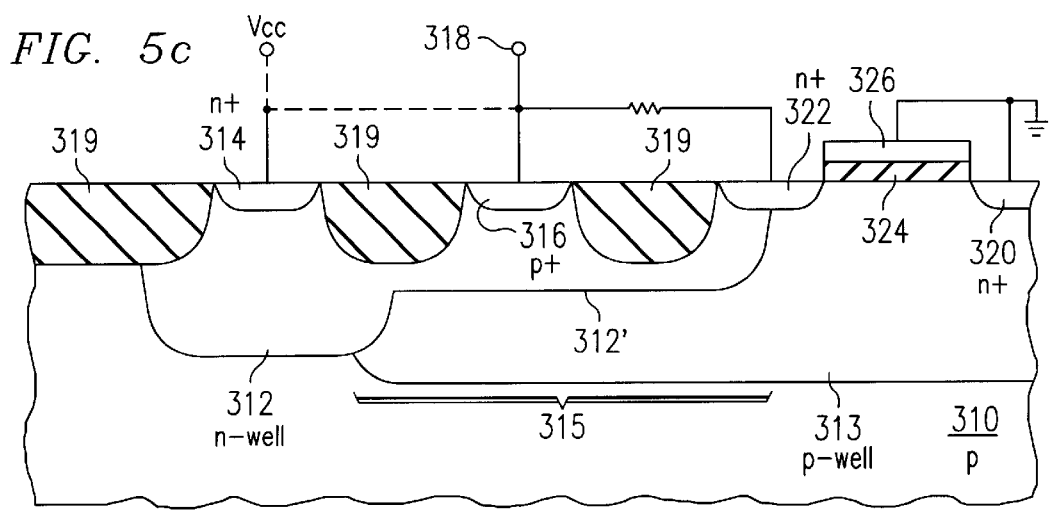

FIG. 5c illustrates a gated low voltage triggered SCR ESD protection device according to another embodiment of the invention. The same reference numerals are used in FIG. 5c for the same elements that are in the structure of FIG. 5b. In the structure of FIG. 5c, and as described in U.S. Pat. No. 5,465,189, assigned to Texas Instruments Incorporated and incorporated herein by this reference, n+ region 322, which straddles the boundary of n-well 312 into p-well 313, is gated by polysilicon electrode 326 overlying gate dielectric 324. Gate electrode 326 is connected to ground along with n+ region 320 in p-well 313. N+ region 322 and n+ region 320 thus form the drain and source, respectively, of an n-channel MOS transistor controlled by gate electrode 326. As described in U.S. Pat. No. 5,465,189, this gated device effectively defines the low triggering voltage of the SCR.

The structure of FIG. 5c, according to this embodiment of the invention and similarly as the structure of FIG. 5b, includes compensated well portion 312' at location 315 underlying p+ region 316, to provide a low base Gummel number for the vertical p-n-p transistor having p+ region 316 as its emitter. This overlap is formed by implanting location 315 with both the n-type implants that form n-well 312, and also the p-type implants that form p-well 313, both well implants preferably designed to provide a retrograde doping profile. The structure of FIG. 5c thus provides a defined low triggering voltage SCR that also has high bipolar gain, as provided by compensated well portion 315. This construction also enables the use of an SCR ESD protection device, especially for protecting input/output terminals, in advanced CMOS processes using such technologies as STI isolation, and silicide-clad diffusions and polysilicon, without requiring the additional cost of an extra photolithography operation.

Figure 1D:
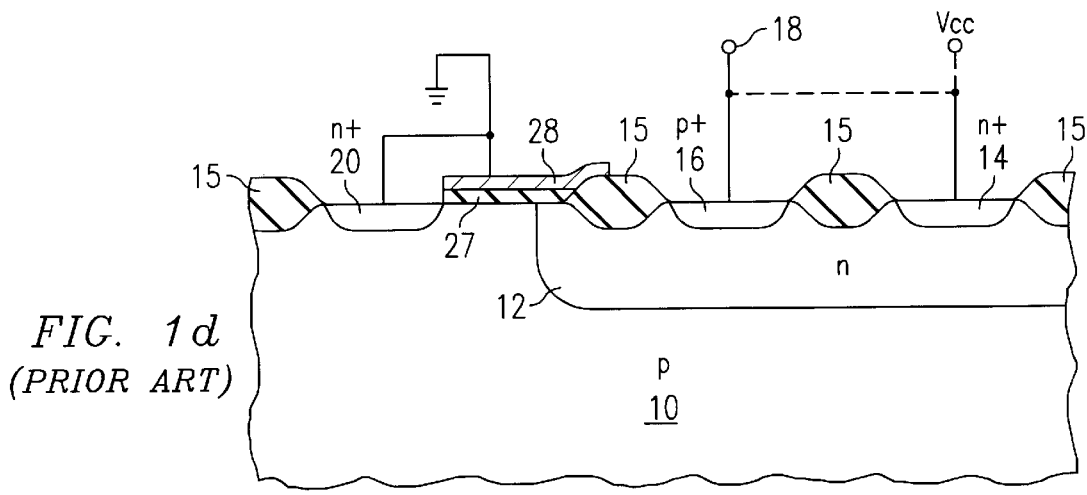
Figure 5D:
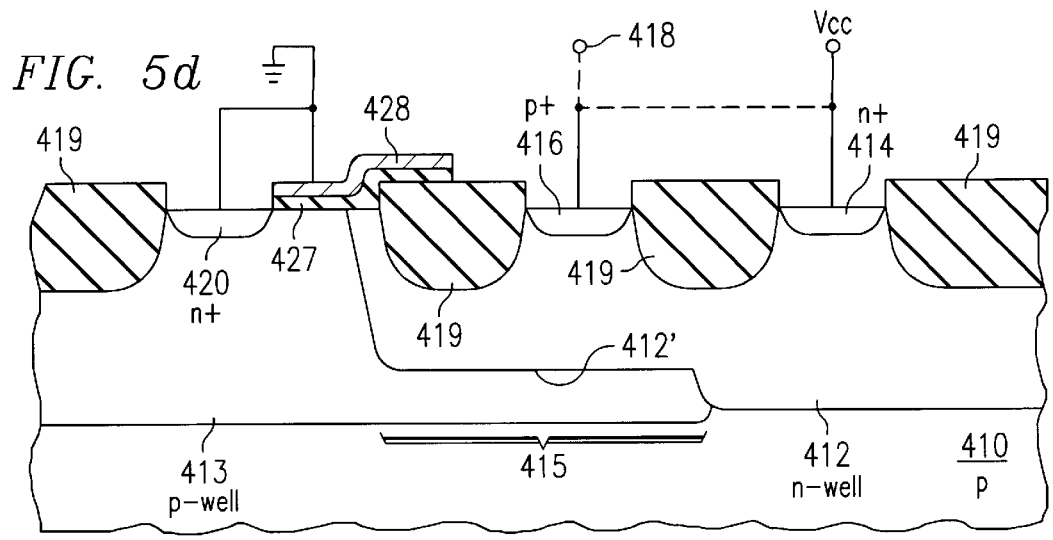

FIG. 5d illustrates a CMOS SCR ESD protection device according to another embodiment of this invention. According to this embodiment, the protection device includes a gated well diode trigger device, such as described in U.S. Pat. No. 5,907,462, and as described above relative to FIG. 1d. Gate electrode 428 overlies gate dielectric 427, straddling the boundary of n-well 412 and p-well 413, and overlapping onto STI structure 419. Shallow trench isolation is used in this embodiment of the invention, in place of the LOCOS isolation shown in FIG. 1d. Gate electrode 428 is connected to ground, along with n+ region 420 that is outside of n-well 412, and located within p-well 413 according to this embodiment of the invention. In operation, as described in U.S. Pat. No. 5,907,462, gate electrode 428 is the gate of a parasitic MOS device, having n-well 412 as its drain and n+ region 420 as its source, and which turns on in response to an ESD event to assist the triggering of the SCR.

As shown in FIG. 5d, p-well 415 extends into n-well 412, forming compensated well portion 412' at location 415 under p+ region 416. Compensated well portion 412' is formed by overlapping the location of the implants for forming n-well 412 and p-well 413, as described above. As in the examples previously described, compensated well portion 412' receives both the n-type implants that form n-well 412 and the p-type implants that form p-well 413. Preferably, these well implants are designed to provide a retrograde doping profile for each well. As a result, the parasitic p-n-p transistor provided by p+ region 418 (emitter), compensated n-well portion 412'(base), and p-well 413 (collector) has a smaller base Gummel number, and thus improved gain, over the device of FIG. 1d in which the full thickness of n-well 412 serves as the base. The structure of FIG. 5d similarly provides SCR-based ESD protection device that is compatible with advanced CMOS features such as silicide-clad diffusions and shallow trench isolation, and useful at high voltage input/output terminals.

Figure 1E:
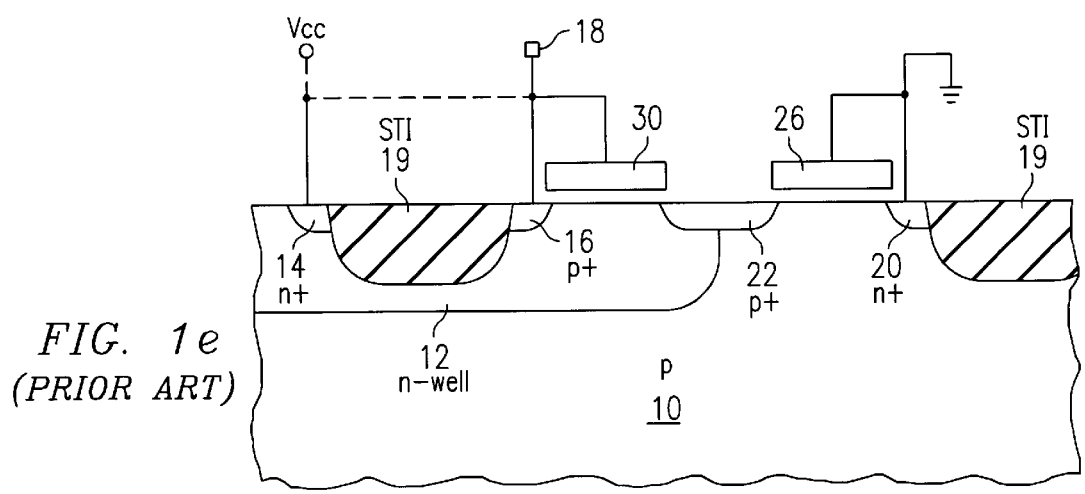
Figure 5E:
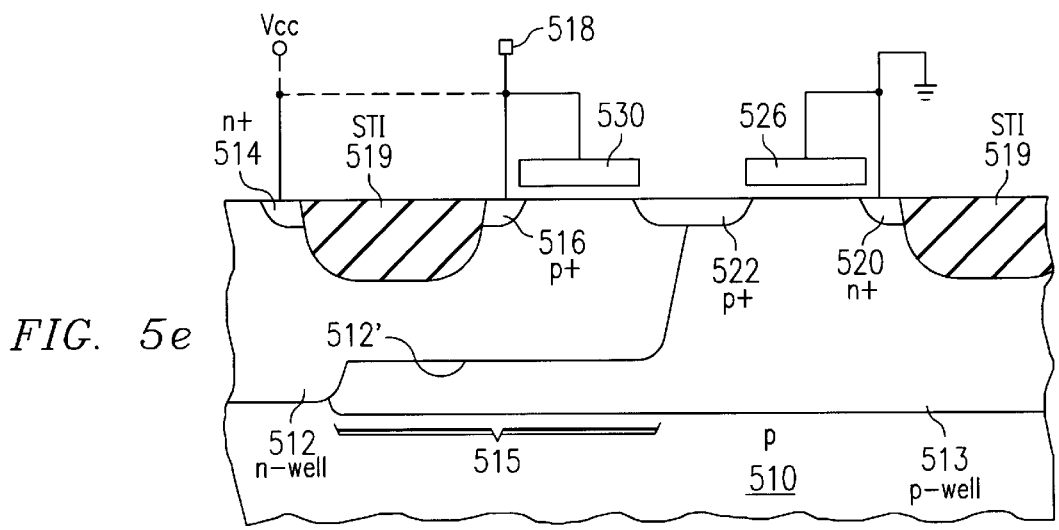

Referring now to FIG. 5e, an SCR-based ESD protection structure according to another preferred embodiment of the invention will be described. This embodiment of the invention utilizes the gated isolation transistor within n-well 512, as described above relative to FIG. 1e and as described in U.S. Pat. No. 6,081,002. This isolation transistor eliminates the need for an isolation structure within the well and the corresponding loss of bipolar gain that such an isolation structure would present. According to this approach, STI structure 519 is disposed between n+ region 514 and p+ region 516 in n-well 512, while p+ region 522 (which alternatively may be an n+ region or adjacent p+ and n+ regions) straddles the well boundary. Gate electrode 526 is located between n+ region 520 and region 522, separated by a gate dielectric from a portion of p-well 513 within which region 522 is partially formed and within which n+ region 520 is formed. Gate electrode 526 is biased to ground with n+ region 520, and gate electrode 530 is located between n+ region 522 and p+ region 516, overlying a gate dielectric, and is connected to terminal 518. In operation, an ESD event at terminal 518 will cause the junction between n-well 512 and p+ region 522 to break down, triggering the SCR to safely conduct the ESD energy. Alternatively, if region 522 is doped n+, the NMOS transistor gated by gate electrode 526 will break down by punchthrough between source and drain regions 520, 522 via p-well 513, to trigger the SCR. Further in the alternative, as described in U.S. Pat. No. 6,081,002, region 522 may be constructed as an adjacent pair of p+ and n+ regions, with both mechanisms present during an ESD event. In any case, gate electrode 530 defines an isolation device between p+ regions 522, 516. In addition, gate electrodes 526 and 530 block the formation of silicide at the surface of p substrate 510 and n-well 512.

According to this embodiment of the invention, compensated well portion 515 receives both the implants defining n-well 512 and the implants defining p-well 513. At this portion 515, compensated n-well portion 512' has a lower net number of impurities than does n-well 512, because of the effects of the compensating p-well implant. As described above, the implants defining n-well 512 and p-well 513 are preferably designed to form retrograde doping profiles, which result in the shallow definition of compensated n-well portion 512' at location 515 as shown in FIG. 5e. The parasitic p-n-p transistor formed by p+ region 516 (emitter), compensated n-well portion 512' (base) and p-well 513 and p substrate 510 (collector) thus has fewer carriers than in the case of the structure of FIG. 1e. This results in a lower base Gummel number, and thus higher gain, for this vertical parasitic device, assisting the conduction of the ESD energy by this structure. As described above, this improved gain is attained without the significant manufacturing cost of an additional photolithography operation, and is compatible with advanced processes including shallow trench isolation and silicidation.

Figure 1F:
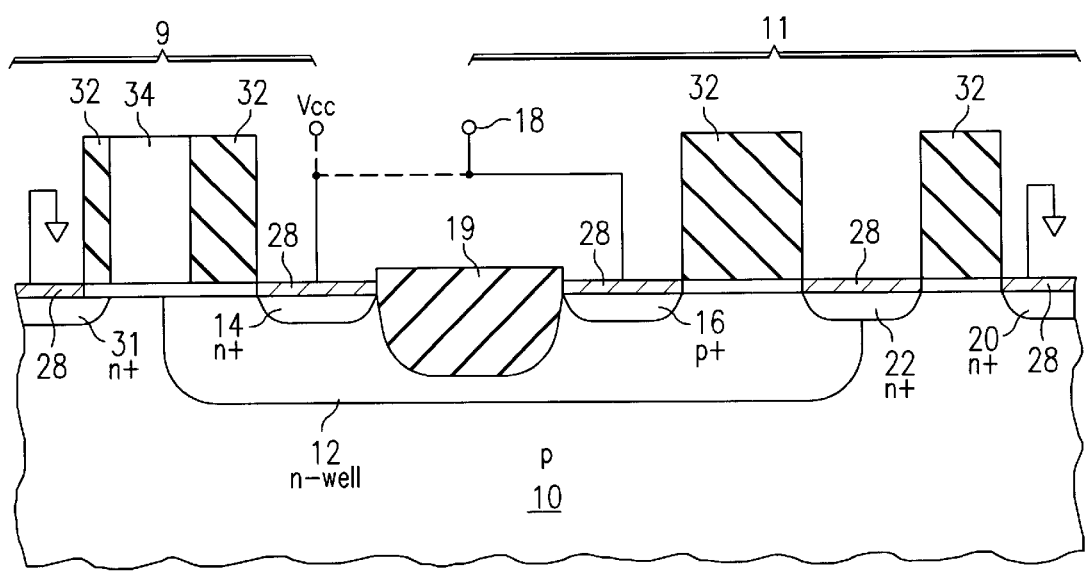
Figure 5F:
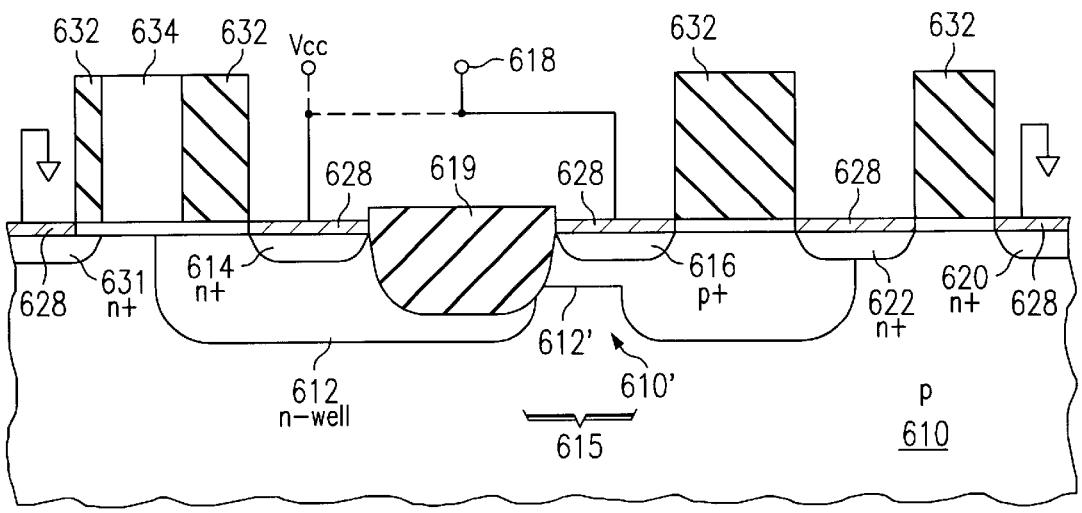

Referring now to FIG. 5f, an ESD protection structure according to another preferred embodiment of the invention will now be described. The structure of FIG. 5f is similar to that of FIG. 1f described above in the Background of the Invention, and involves the use of patterned insulator layers 632 for blocking the formation of silicide film at the surface of the structure (i.e., commonly referred to as "silicide blocks"), and thus involves an additional photolithographic operation and added cost relative to the other embodiments of the invention. However, it is contemplated that the structure of FIG. 5f will be advantageous in applications such as high voltage input/output terminals, in which relatively high voltages are applied to terminal 618. This robustness is due to the significantly thicker silicide blocks 632, as compared to transistor gate dielectric films such as the gate dielectric underlying gate electrode 526 in FIG. 5e, which render silicide blocks 632 much less vulnerable to thin gate dielectric breakdown than such thin gate dielectrics.

As shown in FIG. 5f, source region 631 is connected to ground, while drain 614 within n-well 612 is connected to terminal 618, along with p+ region 616. P+ region 616 and n+ drain region 614 are separated from one another by shallow trench isolation STI structure 619. P+ region 616 is also located within n-well 612, as is a portion of n+ trigger region 622. N+ region 620 is biased to ground and disposed within p-type substrate 610. Each of heavily-doped regions 614, 616, 620, 622, 631 are clad with metal silicide film 628, for improved conductivity. In this structure of FIG. 5f, silicide formation is blocked by nitride structures, serving as silicide blocks 632, and also by polysilicon gate 634, which has nitride sidewall filaments 632. Polysilicon gate 634 defines a drain-extended MOS transistor with n+ region 614 and underlying n-well 612 as the drain, and n+ region 631 as the source, which is connected to device ground. The operation of the structure of FIG. 5f corresponds to that described above relative to FIG. 1f.

According to this embodiment of the invention, compensated well portion 612' of n-well 612 is disposed under at least a part of p+ region 616, at location 615. Compensated well portion 612' receives both the implants defining n-well 612 and the implants used to define p-wells elsewhere in the integrated circuit (such p-wells not shown in FIG. 5f). Compensated n-well portion 612' thus has a lower net number of impurities than does n-well 612, because of the effects of the compensating p-well implant, similarly as described above. Preferably, the implants defining n-well 612 and the compensating p-type implants form retrograde doping profiles. The parasitic p-n-p transistor formed by p+ region 616 (emitter), compensated n-well portion 612' (base) and p substrate 610 (collector) thus has fewer carriers than in the case of the structure of FIG. 1f. This vertical bipolar device thus has a lower base Gunmmel number, which results in higher gain, and improved conduction of the ESD energy.

As evident from the structure of FIG. 5f, compensated n-well portion 612' is formed by a localized implanting of the p-well implants at n-well 612, but the formation of p-wells elsewhere in the vicinity of this structure is suppressed. In the alternative, compensated n-well portion 612' may be formed by the overlap of a p-well with n-well 612, if desired. According to this embodiment of the invention, though, the absence of a p-well adjacent to n-well 612 is contemplated to result in improved ESD performance, because the lower doping concentration of p-substrate 610 adjacent to n-well 612 will result in higher gain. This suppression of p-well formation may also be applied to the other preferred embodiments of the invention illustrated in connection with FIGS. 5a through 5e, if desired. However, this well suppression comes at a cost of an additional photolithography operation, and also the likelihood of an increase in chip area, due to the effect of well spacing design rules.

According to each of these embodiments of the invention, an ESD protection structure is formed that is well-suited for use in advanced CMOS processes. Bipolar conduction, both as a single device and in the context of an SCR, is improved by the compensated well structure, without requiring additional photolithography. Technologies such as shallow trench isolation and silicidation of source/drain regions can now be tolerated without adverse effect on ESD protection. The ability to use an SCR-based ESD protection device thus becomes available, as a result of this invention, for protecting high voltage input/output terminals.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit, comprising:
   functional circuitry, coupled to a terminal; and
   an electrostatic discharge protection device connected to the terminal in parallel with the functional circuitry, and formed at a seniconducting surface of a substrate, comprising:
   a first well of a first conductivity type, disposed at the surface within a portion of the substrate of the second conductivity type;
   a first doped region of a first conductivity type, disposed within the first well;
   a second doped region, of a second conductivity type, disposed within the first well and connected to the terminal; and
   a grounded doped region, disposed at the surface within a portion of the substrate of the second conductivity type;
   wherein a compensated well portion of the first well underlying the second doped region has a lower net number of impurities than other portions of the first well.

2. The integrated circuit of claim 1, further comprising:
   a second well, of the second conductivity type, disposed at the surface;
   wherein the grounded doped region is disposed within the second well.

3. The integrated circuit of claim 2, wherein the second well overlaps with the first well at a location underlying the second doped region, to form the compensated well portion of the first well.

4. The integrated circuit of claim 1, further comprising:
   a third doped region, of the second conductivity type and disposed within the first well, the third doped region connected to the grounded doped region; and
   a transistor gate insulatively disposed between the second and third doped regions, and connected to the terminal.

5. The integrated circuit of claim 1, wherein the first and second doped regions are separated from one another at the surface of the first well by an isolation oxide structure.

6. The integrated circuit of claim 5, wherein the isolation oxide structure is disposed within a trench formed at the surface.

7. The integrated circuit of claim 1, wherein the first conductivity type is n-type and the second conductivity type is p-type.

8. The integrated circuit of claim 1, wherein each of the first and second doped regions, and the grounded doped region, are clad with a metal silicide.

9. The integrated circuit of claim 1, further comprising:
   a second well, of the second conductivity type, disposed at the surface, within which the grounded doped region is disposed;
   wherein the second well overlaps with the first well at a location underlying the second doped region, to form the compensated well portion of the first well;
   and wherein the grounded doped region is of the first conductivity type.

10. The integrated circuit of claim 9, further comprising:
    an overlapping doped region of the first conductivity type, formed at the surface at a boundary location between the first and second wells, the overlapping doped region coupled to the terminal.

11. The integrated circuit of claim 10, wherein the grounded doped region and the overlapping doped region are separated from one another at the surface by an isolation oxide structure.

12. The integrated circuit of claim 11, wherein the isolation oxide structure is disposed in a trench at the surface.

13. The integrated circuit of claim 10, wherein the grounded doped region and the overlapping doped region are separated from one another at the surface of the second well;
    and further comprising:
    a gate electrode insulatively disposed over the portion of the surface of the second well separating the grounded doped region and the overlapping doped region, and coupled to the grounded doped region.

14. The integrated circuit of claim 9, further comprising an isolation oxide structure disposed adjacent to the second doped region;

and further comprising:

a gate electrode insulatively disposed over a portion of the first and second wells, adjacent to the grounded doped region, and extending onto the isolation oxide structure, the gate electrode coupled to the grounded doped region.

15. The integrated circuit of claim 9, further comprising:

an overlapping doped region formed at the surface at a boundary location between the first and second wells;

a first gate electrode, coupled to the terminal, and insulatively disposed over a portion of the first well between the second doped region and the overlapping doped region;

a second gate electrode, coupled to the grounded doped region and insulatively disposed over a portion of the second well between the overlapping doped region and the grounded doped region; and an isolation oxide structure disposed between the first and second doped regions at a surface of the first well.

16. The integrated circuit of claim 15, wherein the overlapping doped region is of the first conductivity type.

17. The integrated circuit of claim 15, wherein the overlapping doped region is of the second conductivity type.

18. The integrated circuit of claim 15, wherein the overlapping doped region comprises a doped region of the first conductivity type adjacent to a doped region of the second conductivity type.

19. The integrated circuit of claim 1, wherein the first doped region is connected to the terminal.

20. The integrated circuit of claim 1, wherein the first doped region is connected to a power supply bus of the integrated circuit.

21. The integrated circuit of claim 1, further comprising:

an overlapping doped region of the first conductivity type, formed at the surface at a boundary location of the first well;

a first silicide block structure disposed between the overlapping doped region and the second doped region;

a second silicide block structure disposed between the overlapping doped region and the grounded doped region;

a source region, of the first conductivity type, formed at the surface outside of the first well; and a gate structure, disposed between the first doped region and the source region, and overlying a boundary location of the first well, to define a drain-extended transistor;

wherein each of the first and second doped regions, the overlapping doped region, and the grounded doped region, are clad with a metal silicide.

* * * * *